US006361880B1

(12) United States Patent
Clevenger et al.

(10) Patent No.: US 6,361,880 B1
(45) Date of Patent: Mar. 26, 2002

(54) CVD/PVD/CVD/PVD FILL PROCESS

(75) Inventors: Larry Clevenger, LaGrangeville; Roy C. Iggulden, Newburgh, both of NY (US); Rainer F. Schnabel, Höehenkirchen (DE); Stefan Weber, Fishkill, NY (US)

(73) Assignees: International Business Machines Corporation, Armonk, NY (US); Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/469,371

(22) Filed: Dec. 22, 1999

(51) Int. Cl.⁷ .................................................. B32B 15/00
(52) U.S. Cl. ........................ 428/620; 428/652; 428/212; 428/213; 438/680
(58) Field of Search ................................ 428/620, 652, 428/450, 213, 212; 257/762, 765; 438/652, 680; 427/124

(56) References Cited

U.S. PATENT DOCUMENTS

| 5,520,784 | A | | 5/1996 | Ward | 204/192.15 |
| 5,814,557 | A | | 9/1998 | Venkatraman et al. | 438/622 |
| 5,851,367 | A | * | 12/1998 | Nguyen et al. | 204/192.34 |
| 5,856,026 | A | | 1/1999 | Joshi et al. | 428/620 |
| 5,877,087 | A | * | 3/1999 | Mosely et al. | 438/656 |
| 5,918,149 | A | | 6/1999 | Besser et al. | 438/680 |
| 6,057,236 | A | * | 5/2000 | Clevenger et al. | 438/680 |
| 6,139,697 | A | * | 10/2000 | Chen et al. | 204/192.15 |
| 6,207,222 | B1 | * | 3/2001 | Chen et al. | 427/97 |

FOREIGN PATENT DOCUMENTS

EP          0776037 A2  *  5/1997

* cited by examiner

*Primary Examiner*—Deborah Jones
*Assistant Examiner*—Stephen Stein
(74) *Attorney, Agent, or Firm*—McGuireWoods, LLP; Steven Capella

(57) ABSTRACT

A method is provided in which intermediate sized structures can be filled without forming voids during the fill process. The methods involve use of a sequence of CVD/PVD/CVD/PVD steps. The methods are especially effective for filling "intermediate" size features in damascene and dual damascene structures.

5 Claims, 1 Drawing Sheet

CVD/PVD/CVD/PVD FILL PROCESS

BACKGROUND OF THE INVENTION

The present invention generally relates to processes for forming damascene structures in semiconductor devices and, more particularly, to a process for filling a combination of intermediate sized features such as slotted vias and trenches and small sized features such as vias.

The typical chemical vapor deposition/physical vapor deposition (CVD/PVD) process which is used for dual damascene structures works extremely well for small and large feature sizes. This process consists of a CVD aluminum seed layer which is first deposited and then a PVD aluminum layer is deposited to fill and reflow into the dual damascene structures. However, in order to fill features of intermediate sizes (0.5 to 2.0 microns), the process has some problems. These include the creation of voids within the fill regions. Since the process works well for both small and large features sizes, it is not clear why problems should be encountered in filling "intermediate" size features.

Thus, there is a need for processes which are effective for filling "intermediate" size features in damascene and dual damascene structures, especially in structures having both intermediate size and small size features.

SUMMARY OF THE INVENTION

The present invention provides a novel process which is effective for filling "intermediate" size features in damascene and dual damascene structures, especially in structures having both intermediate size and small size features.

In one aspect, the invention encompasses methods of forming a filled metal structures in a material layer of a substrate, the methods comprising:

providing a substrate having a material layer containing a recess therein relative to a first surface of the layer;

depositing a first amount of metal into the recess by chemical vapor deposition;

depositing a second amount of metal into the recess by physical vapor deposition over the first amount of metal;

depositing a third amount of method by chemical vapor deposition over the second amount of metal; and depositing a fourth amount of metal by physical vapor deposition or sputtering over the third amount of metal, wherein the first amount of metal, the second amount of metal, the third amount of metal and the fourth amount of metal equal a total amount of metal having a thickness sufficient to completely fill the recess.

The methods of the invention are especially useful for filling damascene and/or dual damascene recess structures in dielectric material layers, more especially structures having widths on the order of 0.5–2.0 microns.

In another aspect, the invention also encompasses integrated circuit structures containing the filled damascene or dual damascene structures, especially structures such as filled slot vias.

These and other aspects of the invention are described in further detail below.

DETAILED DESCRIPTION OF THE INVENTION

The present invention provides novel methods which are effective for filling "intermediate" size features in damascene and dual damascene structures, especially in structures having both intermediate size and small size features.

The methods of the invention are characterized by use of a specific sequence of filling steps in a provided substrate having a material layer containing a recess therein relative to a first surface of the layer:

depositing a first amount of metal into the recess by chemical vapor deposition;

depositing a second amount of metal into the recess by physical vapor deposition over the first amount of metal;

depositing a third amount of method by chemical vapor deposition over the second amount of metal; and depositing a fourth amount of metal by physical vapor deposition or sputtering over the third amount of metal, wherein the first amount of metal, the second amount of metal, the third amount of metal and the fourth amount of metal equal a total amount of metal having a thickness sufficient to completely fill the recess.

The substrate provided is preferably a silicon wafer, however, the invention is not limited to any specific substrate configuration. For example, other semiconductor substrates such as gallium arsenide, germanium, silicon on insulator (SOI), or other semiconductor materials are also useful in this process. The substrate or portions thereof may be lightly or heavily doped with dopants to achieve the desired electrical characteristics.

The substrate includes any features formed in and/or on the substrate. Such features would typically correspond to devices that form an integrated circuit (IC). Typically included on the substrate are one or more previously defined device layers wherein contact with another conductive layer is desired. In some instances, the device layer may be located within the same layer as the features to be filled. The device layer, for example, may represent a portion of an underlying metallization layer. Alternatively, the device layer contain a highly doped silicon, polysilicon layer, or a portion of an active device such as a source, gate, or drain region of a transistor. In one embodiment, a device layer presents a bitline of a DRAM device. The material layer in which the filled structures of the invention are formed is preferably a dielectric material layer such as commonly used in damascene and/or dual damascene processes.

Figure 1A:
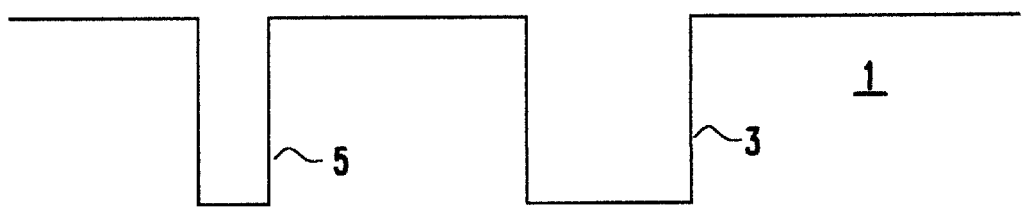
FIG. 1A is a cross-section of showing a portion of a substrate having an intermediate feature and a small feature which are to be filled.
Figure 1B:
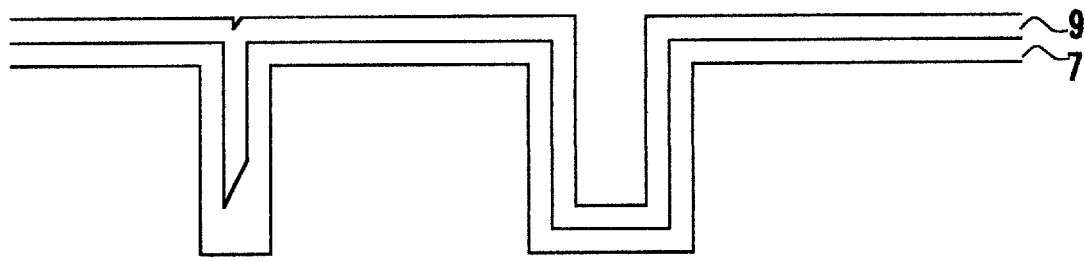
FIG. 1B is a cross-section of the feature shown in FIG. 1A after the first CVD/PVD process steps.
Figure 1C:
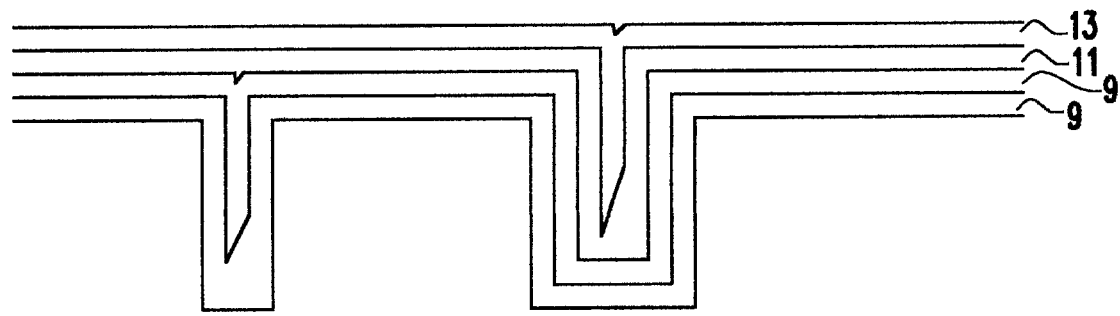
FIG. 1C is a cross-section of the feature shown in FIG. 1B after the second CVD/PVD process steps.

Referring now to the drawings, and more particularly to FIGS. 1A, 1B and 1C, there is shown the steps an the inventive process. FIG. 1A is a cross section of typical silicon wafer 1. The cross section shown has an intermediate size feature 3, such as a trench, via or slot via, having a width of about 0.5–2.0 microns. Also shown is a small feature 5 having a width of less than 0.5 microns. It should be understood that features that have a cross-section of greater than 2 microns are generally considered "large" sized features.

The portion of substrate 1 defining the walls of features 3 and 5 is preferably a dielectric material such as would typically be used as a damascene or dual damascene layer. If desired, the features may be lined with a liner material such as titanium or titanium nitride using known deposition techniques. The recess feature widths described herein refer to the widths immediately prior to the four deposition sequence of the invention.

The deposition of the first amount of metal by chemical vapor deposition provides a seed layer 7 (FIG. 1B). The CVD seed layer may be a non-continuous or continuous coating up to about 1000 Å in thickness. The formation of the seed layer may be performed by techniques such as described in U.S. patent application Ser. No. 09/105,644, filed Jun. 26, 1998, now U.S. Pat. No. 6,057,236, the disclosure of which is incorporated herein by reference, or by other known techniques.

The deposition of the second amount of metal 9 is performed using a physical vapor deposition (PVD) technique. For example, the PVD may be accomplished by a sputter or plasma from a metal (e.g., aluminum) target within the same tool set as used for deposition of the first amount of metal. The deposition temperature is preferably about 300°–450° C. The second amount of metal is preferably deposited to a thickness of about 500–5000 Å.

The deposition of the third amount of metal 11 (FIG. 1C) is deposited by CVD, preferably in an amount sufficient to act as a second seed metal layer. Thus, the deposition technique and deposited layer characteristics are preferably similar to those described above for the deposition of the first amount of metal.

The deposition of the fourth amount of metal 13 is performed using a physical vapor deposition (PVD) technique. For example, the same PVD techniques as used in the first PVD step may be used to carry out the deposition of the fourth amount of metal here. The fourth amount of metal is preferably deposited in an amount such that the total amount of metal deposited in the four deposition steps is sufficient to completely fill recesses 3 and 5. Typically, the fourth amount of metal will be deposited to a thickness of about 500–100,000 Å.

After deposition of the fourth amount of metal, the metal is preferably reflowed to ensure filling of the recess structures and/or to improve the integrity of the deposited metal.

The CVD/PVD/CVD/PVD methods of the present invention advantageously fill intermediate-sized features without leaving voids. The extent and quality of filling can be determined using analytical techniques such as SEM and/or by testing the electrical characteristics (e.g., line resistance) of the resulting features.

The metals used in the process of the invention are preferably selected from the group consisting of aluminum, copper, aluminum alloys, copper alloys or other reflowable metals. Preferably, the same metal composition is used for each of the four depositions, however, it may be possible to use different, but compatible compositions for the different depositions. For example, it may be possible to use a combination of aluminum and Al—Cu alloy depositions. Where aluminum is used as the metal, preferably the CVD steps use a precursor such as dimethyl aluminum hydride and the PVD steps would use an appropriate aluminum source (target).

The process of the invention advantageously may be carried out in a single tool set such as an ENDURA depostion tool provided by Applied Materials, Inc. Alternatively, other known deposition tools or combinations of tools may be used.

While the invention has been described in terms of a single preferred embodiment, those skilled in the art will recognize that the invention can be practiced with modification within the spirit and scope of the appended claim

What is claimed is:

1. A semiconductor substrate, comprising:
    at least one first feature of less than about 0.5 microns in width;
    at least one second feature of about 0.5 to about 2.0 microns in width;
    a first CVD metal layer formed on said substrate including inner surfaces of said first and second features;
    a first PVD metal layer formed on said first CVD metal layer, wherein said first feature is filled by said first CVD metal layer and said first PVD metal layer;
    a second CVD metal layer formed on said first PVD metal layer; and
    a second PVD metal layer formed on said second CVD metal layer, wherein said second feature is filled by said second CVD metal layer and said second PVD metal layer.

2. The semiconductor substrate of claim 1, wherein said first and second CVD and PVD metal layers comprise the same metal.

3. The semiconductor substrate of claim 2, wherein said first and second CVD and PVD metal layers are selected from the group consisting of aluminum, copper and aluminum-copper alloys.

4. The semiconductor substrate of claim 1, wherein said first and second CVD metal layers are each up to about 1000 Å thick.

5. The semiconductor substrate of claim 1, wherein said first and second PVD metal layers are at least about 500 Å thick.

\* \* \* \* \*